(12) United States Patent
Hung et al.

(10) Patent No.: US 9,362,399 B2
(45) Date of Patent: Jun. 7, 2016

(54) WELL IMPLANT THROUGH DUMMY GATE OXIDE IN GATE-LAST PROCESS

(71) Applicant: Taiwan Semiconductor Manufacturing Company, Ltd., Hsin-Chu (TW)

(72) Inventors: Sheng Chiang Hung, Hsinchu (TW); Huai-Ying Huang, Jhonghe (TW); Ping-Wei Wang, Hsin-Chu (TW)

(73) Assignee: Taiwn Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/600,847

(22) Filed: Jan. 20, 2015

(65) Prior Publication Data

US 2015/0155382 A1    Jun. 4, 2015

Related U.S. Application Data

(62) Division of application No. 12/789,780, filed on May 28, 2010, now Pat. No. 8,940,589.

(60) Provisional application No. 61/320,984, filed on Apr. 5, 2010.

(51) Int. Cl.
| | |
|---|---|
| *H01L 27/06* | (2006.01) |
| *H01L 29/78* | (2006.01) |
| *H01L 29/66* | (2006.01) |
| *H01L 29/08* | (2006.01) |
| *H01L 29/167* | (2006.01) |

(Continued)

(52) U.S. Cl.
CPC ........ *H01L 29/7836* (2013.01); *H01L 29/0847* (2013.01); *H01L 29/167* (2013.01); *H01L 29/495* (2013.01); *H01L 29/4966* (2013.01); *H01L 29/6659* (2013.01); *H01L 29/66545* (2013.01); *H01L 21/823807* (2013.01); *H01L 21/823892* (2013.01)

(58) Field of Classification Search
CPC ................ H01L 21/823814; H01L 21/823807
See application file for complete search history.

(56) References Cited

U.S. PATENT DOCUMENTS

| 5,675,176 | A | | 10/1997 | Ushiku | |
|---|---|---|---|---|---|
| 6,093,951 | A | * | 7/2000 | Burr .............................. | 257/408 |

(Continued)

OTHER PUBLICATIONS

Chinese Patent Office, Office Action dated Oct. 8, 2012, Application No. 201010612269.7, 8 pages.

*Primary Examiner* — Zandra Smith
*Assistant Examiner* — Andre' C Stevenson
(74) *Attorney, Agent, or Firm* — Haynes and Boone, LLP

(57) ABSTRACT

The present disclosure relates to methods for fabricating a field-effect transistor. The method includes performing a pocket implantation to a semiconductor substrate; thereafter forming a polysilicon layer on the semiconductor substrate; and patterning the polysilicon layer to form a polysilicon gate.
The field-effect transistor (FET) includes a well of a first type dopant, formed in a semiconductor substrate; a metal gate disposed on the semiconductor substrate and overlying the well; a channel formed in the semiconductor substrate and underlying the metal gate; source and drain regions of a second type dopant opposite from the first type, the source and drain regions being formed in the semiconductor substrate and on opposite sides of the channel; and a pocket doping profile of the first type dopant and being defined in the well to form a continuous and uniform doping region from the source region to the drain region.

20 Claims, 9 Drawing Sheets

(51) Int. Cl.
*H01L 29/49* (2006.01)
*H01L 21/8238* (2006.01)

(56) References Cited

U.S. PATENT DOCUMENTS

| | | | |
|---|---|---|---|
| 6,633,069 B2 * | 10/2003 | Nii | H01L 29/41708 |
| | | | 257/197 |
| 6,830,998 B1 | 12/2004 | Pan | |
| 7,291,886 B2 | 11/2007 | Doris | |
| 7,576,406 B2 * | 8/2009 | Tamaki | H01L 27/0823 |
| | | | 257/506 |
| 7,642,140 B2 | 1/2010 | Bae | |
| 2004/0238883 A1 | 12/2004 | Nishinohara | |
| 2005/0118792 A1 * | 6/2005 | Chakravarthi et al. | 438/527 |
| 2006/0065937 A1 * | 3/2006 | Hoffmann et al. | 257/401 |
| 2006/0068556 A1 * | 3/2006 | Noda | 438/305 |
| 2006/0160292 A1 * | 7/2006 | Anderson et al. | 438/199 |
| 2008/0009115 A1 | 1/2008 | Willer | |
| 2008/0036008 A1 | 2/2008 | Hirase et al. | |
| 2008/0311717 A1 * | 12/2008 | Bulucea | 438/290 |
| 2009/0042359 A1 * | 2/2009 | Lindsay et al. | 438/433 |
| 2009/0179280 A1 | 7/2009 | Kohli | |

* cited by examiner

WELL IMPLANT THROUGH DUMMY GATE OXIDE IN GATE-LAST PROCESS

PRIORITY DATA

This application is a divisional application of U.S. patent application Ser. No. 12/789,780, filed May 28, 2010, which claims priority to U.S. Provisional Application No. 61/320,984 filed Apr. 5, 2010, each of which is incorporated herein by reference in its entirety.

TECHNICAL FIELD

The present disclosure relates generally to processes for fabricating deep-submicron integrated circuits. Specifically, the present disclosure relates to a high-k (dielectric) gate-last fabrication process to achieve dopant confinement and robust Vt (threshold voltage) for MOS (metal-oxide-semiconductor) devices.

BACKGROUND

Processes for fabricating wafers of integrated circuits include a series of steps by which a set of geometric patterns is transformed onto the wafers. For example, a process for fabricating integrated circuits of MOS (metal-oxide-semiconductor) FET (field-effect transistors) include a series of steps for transforming geometric patterns determined by the transistors and their interconnections onto a number of superimposed layers of semiconductor, insulating, and conducting materials on a substrate. MOS transistors are semiconductor switching devices where a voltage on a gate controls a channel of conduction current from a drain to a source region of the transistors. One characteristic of the MOS transistors is the Vt (threshold voltage) which is the minimum voltage applied to the gate with respect to the substrate that would allow the conduction channel between the drain and the source to form. Since the Vt determines the gate voltage for turning the MOS transistors on or off, it has to be determined and carefully controlled through the fabrication process.

However, as the MOS transistors are scaled down to form integrated circuits with higher level of integration and faster speed, physical phenomena due to the small size of the transistors impinge on performance characteristics of the transistors. For example, the channel length between the drain and the source regions and the drain-to-source current flowing through the channel should ideally remain constant (saturation current) when the voltage on the drain (Vd) exceeds a pinch-off voltage. However, short channel effects caused by the small transistor size may expand a depletion region at the drain beyond the pinch-off voltage. The spreading depletion region causes the effective channel length to decrease. As a result, the saturation current keeps increasing beyond pinch-off. In the extreme case, current carriers may "punch through" between the drain and source, causing the gate voltage to lose its ability to control the conduction channel.

Various strategies including the introduction of implant gradients or highly doped pockets of dopants in the well implant (pocket or halo implants) are used to mitigate the short channel effects. However, pocket implants may suffer from "shadowing effects" caused by the close proximity of the polysilicon (poly) layers on the gates of adjacent transistors during the implantation step. Shadowing effects reduce the effectiveness of the pocket implants in mitigating the short channel effects. Other strategies to combat short channel effects include implanting a heavy doping concentration in the well to introduce a retrograde well profile. However, the high thermal budget required to form the gate oxide layer after well implant may result in an out-diffusion of the well dopants and a degraded retrograde well profile may result. In addition, the short channel length, the heavy doping concentration of the well implant, and the high thermal budget for oxide layer formation all tend to increase fluctuations in Vt, making Vt more difficult to control. The short channel effects and the variance in Vt are exacerbated as the gate geometry shrinks to the deep-submicron scale, reducing yields of the next generation technology nodes such as the 22 nm node and beyond. Accordingly, there is a need for a fabrication process that mitigates the short channel effects, decreases the variance in Vt, prevents the shadowing effects during pocket implant, reduces the out-diffusion of well dopants, and yields a better retrograde well profile.

SUMMARY

Methods are disclosed herein for fabricating a field-effect transistor. The method includes performing a pocket implantation to a semiconductor substrate; thereafter forming a polysilicon layer on the semiconductor substrate; and patterning the polysilicon layer to form a polysilicon gate.

In accordance with one or more embodiments of the present disclosure, a method for making a field-effect transistor is disclosed. The method includes forming a dummy oxide layer on a surface of a semiconductor substrate; performing a well implant through the dummy oxide layer, controlling a threshold voltage (Vt) of the field-effect transistor; performing a pocket implant through the dummy oxide layer to eliminate shadowing effect; thereafter depositing a polycrystalline semiconductor layer on the dummy oxide layer; patterning the polycrystalline semiconductor layer and the dummy oxide layer to form a dummy poly gate of the transistor; forming a source and a drain; and replacing the dummy poly gate with a metal gate.

In accordance with one or more embodiments of the present disclosure, a field-effect transistor (FET) is disclosed. The FET includes a well of a first type dopant, formed in a semiconductor substrate; a metal gate disposed on the semiconductor substrate and overlying the well; a channel formed in the semiconductor substrate and underlying the metal gate; source and drain regions of a second type dopant opposite from the first type, the source and drain regions being formed in the semiconductor substrate and on opposite sides of the channel; and a pocket doping profile of the first type dopant and being defined in the well to form a continuous and uniform doping region from the source region to the drain region.

In accordance with one or more other embodiments of the present disclosure, a field-effect transistor (FET) is disclosed. The FET includes a well of a first type dopant, formed in a semiconductor substrate; a metal gate disposed on the semiconductor substrate and overlying the well; source and drain regions of a second type dopant, formed in the semiconductor substrate and interposed by the metal gate, the second type dopant is opposite to the first type dopant; a channel in the semiconductor substrate, wherein the channel is underlying the metal gate and formed horizontally between the source and drain regions; a retrograde well profile of the first type dopant and a first doping concentration, the retrograde well profile is defined in the well and having a first depth; and a pocket doping profile of the first type dopant and a second doping concentration greater than the first doping concentration, the pocket doping profile is defined in the well to form a continuous doping region from the source region to the drain region, and having a second depth less than the first depth.

These and other embodiments of the present disclosure will be more fully understood by reference to the following detailed description when considered in conjunction with the following drawings.

BRIEF DESCRIPTION OF THE DRAWINGS

FIGS. 6A-5F (hereinafter referred to collectively as FIG. 6) show cross-sectional views of a N-channel MOS transistor and a P-channel MOS transistor at different stages of fabrication using the process of FIG. 4 according to one or more embodiments of the present disclosure;

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
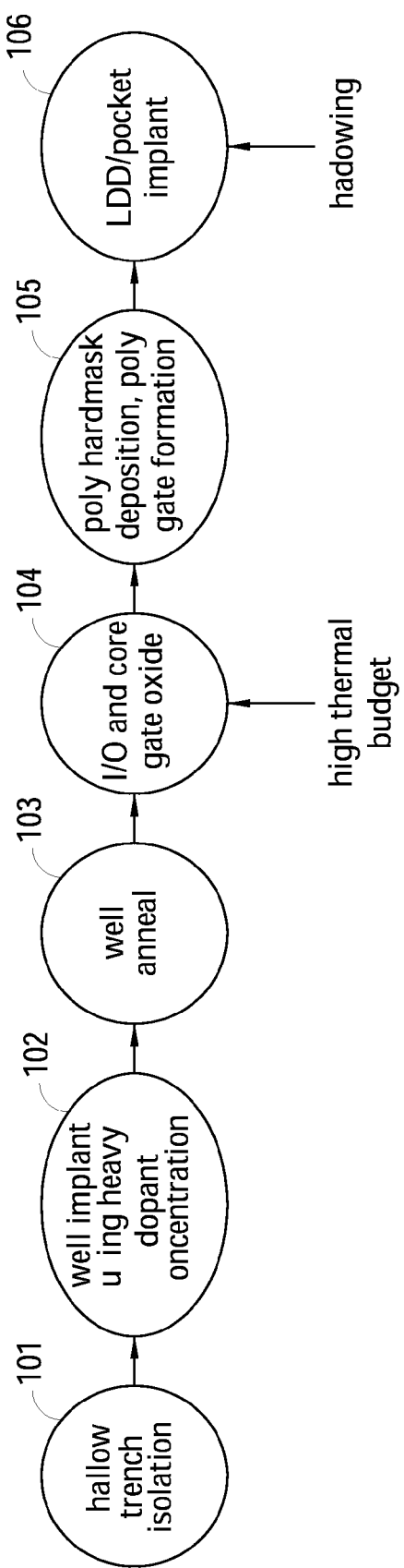
FIG. 1 shows a process for fabricating MOS transistors by performing well implants with a heavy concentration of dopants before gate oxide formation.
Figure 2A:
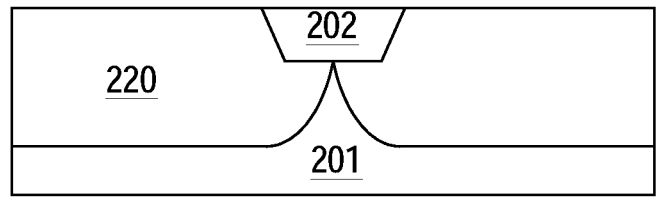
FIGS. 2A-2E (hereinafter referred to collectively as FIG. 2) show cross sectional views of an N-channel MOS transistor and a P-channel MOS transistor at different stages of fabrication using the process of FIG. 1.
Figure 2B:
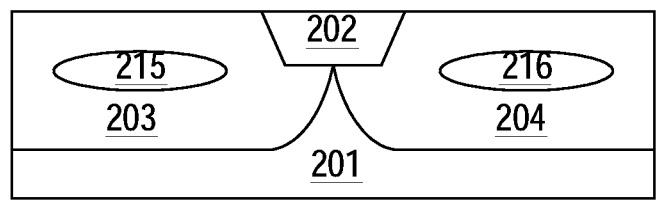
Figure 2C:
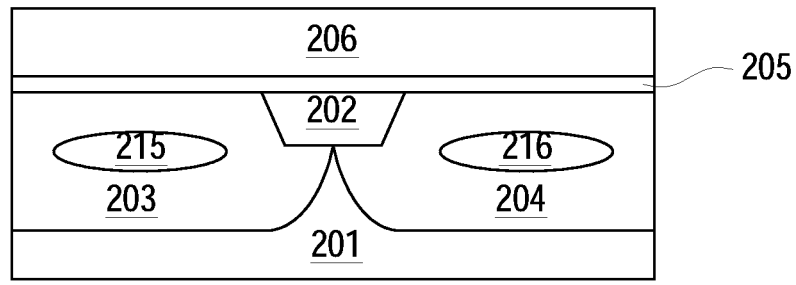
Figure 2D:
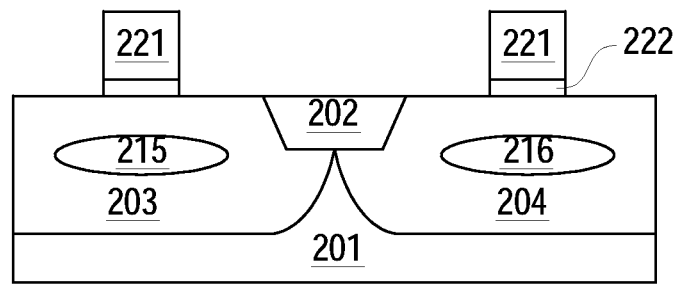
Figure 2E:
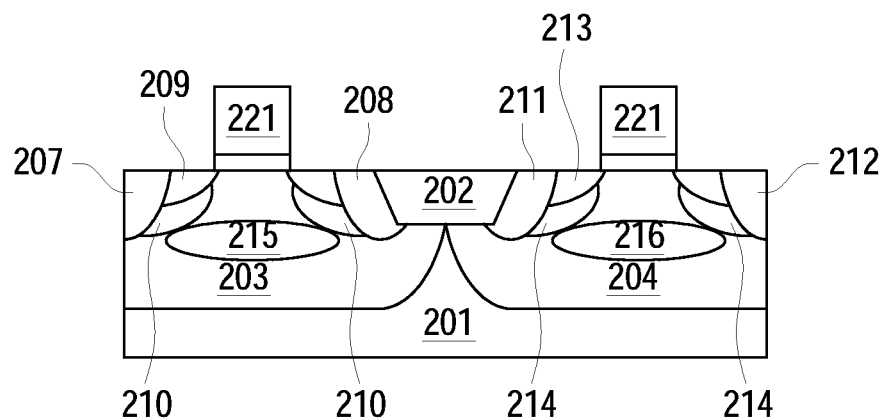

The present disclosure relates to methods for fabricating MOS transistors through the use of dummy gate oxide in a gate-last process and for performing well implants with a light concentration of dopants after the dummy gate oxide formation. It is understood that the present disclosure may be embodied in many different forms and embodiments, and that specific embodiments shown herein are provided only as examples. Further, the scope of the present disclosure will only be defined by the appended claims. In the drawings, the sizes and relative sizes of layers and regions may be exaggerated for clarity. It will be understood that when an element or layer is referred to as being "on," "connected to" or "coupled to" another element or layer, it may be directly on, connected to, or coupled to the other element or layer, or intervening elements or layers may be present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may likewise be interpreted accordingly.

Hereinafter, embodiments of the present invention will be explained in detail with reference to the accompanying drawings.

FIG. 1 shows a process for fabricating MOS transistors by performing well implants with a heavy concentration of dopants before gate oxide formation. Starting with a wafer substrate such as a semiconductor substrate of silicon, germanium, and/or a compound semiconductor material, a shallow trench isolation (STI) is formed on the substrate in step 101. The STI may be formed to isolate the NMOS transistor from the PMOS transistor of a CMOS (complementary MOS) transistor pair.

Step 102 performs the well implant using a heavy concentration of dopants to form wells in the semiconductor substrate. For example, for a NMOS transistor, a P-well is implanted into the substrate, and for a PMOS transistor, an N-well is implanted into the substrate. One reason for the heavy concentration of dopants in the well implant is to introduce a retrograde well profile for mitigating the short channel effects. The retrograde well is implanted in the channel region to control the expansion of the depletion region without influencing the mobility of carriers in the channel via high impurity scattering. However, because the variance in the threshold voltage Vt is proportional to the square root of the dopant concentration, considerations also have to be given to controlling the influence of the dopant concentration on Vt. A second reason for the heavy dopant concentration in the well implant is to compensate for the out-diffusion of the well dopants when the gate oxide layer is grown following well implant. As mentioned, the out-diffusion of the dopants is caused by the high thermal budget required to grow the gate oxide layer.

Step 103 performs the annealing of the wells to remove damages to the substrate crystal caused by the implantation step. In step 104, a dielectric layer is grown by exposing the wafer to oxygen in a high temperature environment to grow a thin layer of oxide such as a layer of silicon oxide on the wafer surface. Because gate oxide formation is performed after well implant and because growing the oxide layer requires a high thermal budget, an out-diffusion of the well dopants and degradation in the retrograde well profile may result, reducing the effectiveness of the doping profiles to control the short channel effects.

In step 105, a layer of polycrystalline semiconductor material, for example a layer of polycrystalline silicon that is usually called polysilicon (or poly for short), is deposited on top of the oxide layer. In addition, a hard-mask layer such as one made of SiN may also be deposited. The poly layer will form the gates of the MOS transistors and may also serve as a layer for circuit interconnections. The poly layer is then patterned through a photolithography method and the oxide layer not covered by the poly layer may be removed. The patterned poly layer in combination with the oxide layer underneath thereof forms the poly gates. In step 106, ion diffusion or ion implantation is performed to diffuse or implant ions into the wells to form the source and drain regions of the transistors. For example, for NMOS transistors, n-type impurities such as arsenic, antimony, phosphorous, or other materials are diffused or implanted into the P-well to form the $n^+$ source and the $n^+$ drain regions. Similarly, for PMOS transistors, p-type impurities are diffused or implanted into the N-well to form the p⁺ source and drain regions.

As the Vd (drain voltage) is increased, the depletion region near the drain may expand, reducing the effective channel length. To control short channel effects from the greatly reduced effective channel length when the Vd is greater than the pinch-off voltage, a lightly doped drain (LDD) region may be implanted near the channel in step 106. The LDD changes the depletion region into a channel to mitigate the reduction in the effective channel length. For NMOS transistors, the LDD changes the drain/well junction near the gate from an n⁺p region into an np region to reduce the depletion region near the drain. It also reduces the electric field at the drain and limits the punch through phenomenon when the current carriers induced by the high electric fields between the drain and the source punch through the region between the two electrodes. To further control the short channel effects, pocket implants of the well may be performed to introduce highly doped pockets underneath the channel near the junctions between the drain and the gate and also between the source and the gate. Pocket implants seek to reduce the depletion width extending underneath the channel since the depletion width extends in the direction of a lower doped region. For example, in NMOS transistors, pocket implants introduce a p⁺ region into the P-well. Because pocket implants are introduced into the wells near the junctions between the drain/source regions and the gates, the ion beams for the implants may not be projected onto the wafers at a perpendicular angle to the wafer surface. Due to the close proximity of the poly gates of adjacent transistors, the non-perpendicular incident ion beams may be blocked by the poly gates, causing the pocket implants to have an uneven distribution of implanted ions. The resulting effect is called the shadowing effect and may degrade the effectiveness of the pocket implants to mitigate the short channel effects.

FIG. 2 shows a cross-sectional view of an N-channel and a P-channel MOS transistors fabricated using the process of FIG. 1. Starting with a wafer of silicon substrate 201, active regions 220 are defined on the semiconductor substrate by forming STI 202, which is configured to isolate various devices formed in the active regions 220 corresponding to process step 101. The active regions 220 are then implanted with a heavy concentration of dopants followed by annealing to form the wells corresponding to process steps 102 and 103. For example, to form a P-well 203 of a NMOS transistor, a heavy concentration of p-type impurities is implanted into an active region. Similarly, to form an N-well 204 of a PMOS transistor, a heavy concentration of n-type impurities is implanted into an active region. To mitigate the short channel effects, retrograde wells of heavier doping concentration may be implanted into the wells. As an example, a p⁺ doped retrograde well 215 may be implanted into the P-well 203 of the NMOS transistor, and a n⁺ doped retrograde well 216 may be implanted into the N-well 204 of the PMOS transistor.

A thin dielectric layer of oxide 205 is then grown on the wafer surface corresponding to process step 104 by exposing the wafer to oxygen using a high thermal budget. A poly layer 206 is also deposited on top of the oxide layer 205 by processes such as chemical vapor deposition (CVD), physical vapor deposition (PVD), electro-chemical deposition, molecular manipulation, etching, chemical mechanical polish, and/or other processes. The poly layer 206 is patterned through a photolithography process corresponding to step 105 to form gate electrode layers 221 of poly gates of the MOS transistors. The thin oxide layer not covered by the poly layer 206 may then be etched away. As mentioned, the high thermal budget required to grow the oxide layer 205 following well implant induces an out-diffusion and results in degraded retrograde wells 215, 216. These effects may necessitate further increase in well doping concentration, making it more difficult to control the fluctuation in Vt.

Ion implantation corresponding to process step 106 is performed to form the source and the drain regions of the transistors. For the NMOS transistor, n-type impurities may be implanted into the P-well 203 to form a n⁺ drain 207 and a n⁺ source region 208. Similarly, for the PMOS transistor, p-type impurities may be implanted into the N-well 204 to form a p⁺ drain 211 and a p⁺ source 212 region. To control short channel effects, a LDD region may be implanted near the poly gate. For the NMOS transistor, a lightly doped n-region 209 may be implanted at the junction of the n⁺ drain region 207 and the poly gate. Similarly, for the PMOS transistor, a lightly doped p-region 213 may be implanted at the junction of the p⁺ drain region 211 and the poly gate. To further control the short channel effects, pocket implant may be performed to introduce highly doped pockets into the wells near the LDD regions and near the junctions between the source regions and the poly gates. For example, for the NMOS transistor, a pocket region of p⁺-type impurities 210 may be implanted into the P-well 203 near the lightly doped n-region 209 of the drain 207 and also near the source 208. Similarly, for the PMOS transistor, a pocket region of n⁺-type impurities 214 may be implanted into the N-well 204 near the lightly doped p-region 213 of the drain 211 and also near the source 212. As mentioned, because pocket implants are introduced into the wells after poly deposition, the close proximity of the poly gates of adjacent transistors may block the non-perpendicular incident ion beams. The resulting shadowing effects may degrade the effectiveness of the pocket implants in mitigating the short channel effects. Thus formed pocket implant doping profile is not uniformly distributed in the active region. In one embodiment, the pocket implant dopant is substantially distributed near the LDD regions, and has no or much less doping species in the channel region. In furtherance of the embodiment, the doping concentration of the pocket implant from the channel edge (adjacent the LDD region) to the channel center is gradually decreased to a smaller level or reduced to none. In one particular example, the doping concentration of the pocket implant at the channel edge is around $6 \times 10^{19}$ atoms/cm³ while the doping concentration of the pocket implant at the channel center is around $1 \times 10^{19}$ atoms/cm³. If the non-uniformity of the pocket implant is evaluated by the relative difference between the doping concentration at the channel edge Ce and doping concentration at the channel center Cc as U=(Ce-Cc)/Ce. In this case, U is greater than about 83%.

Figure 3:
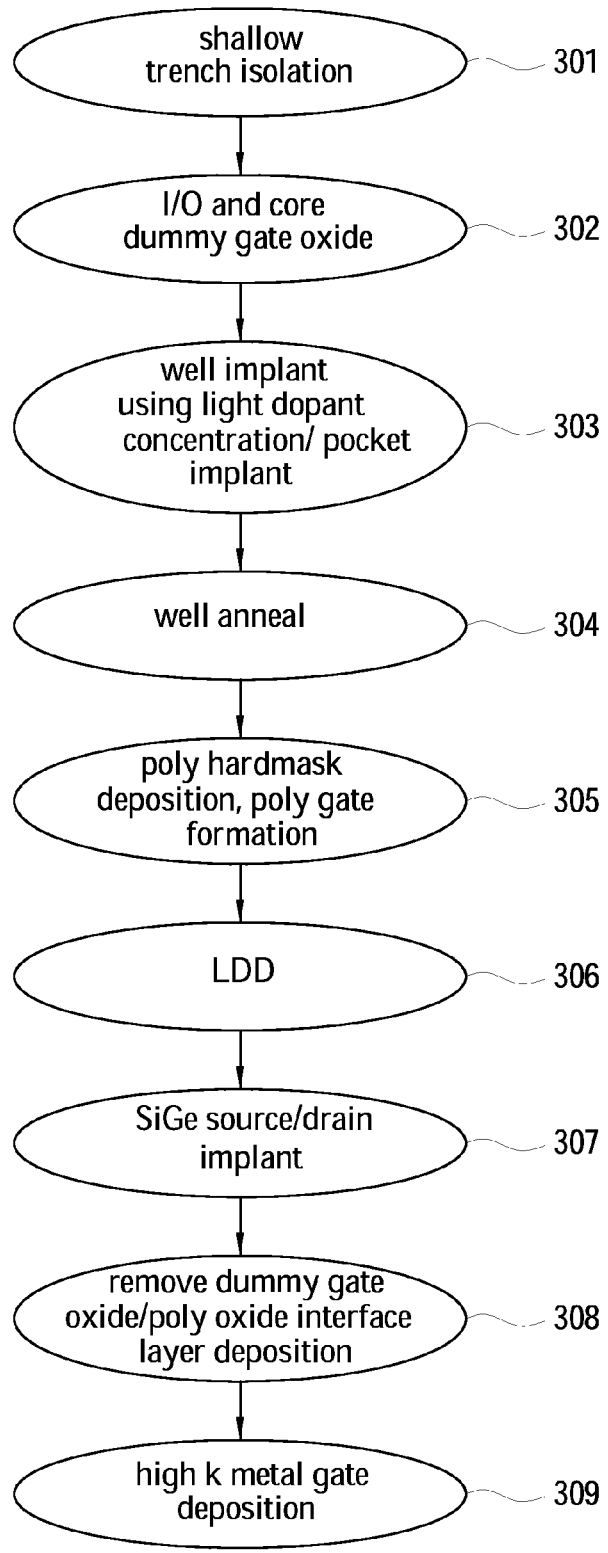
FIG. 3 shows a process for fabricating MOS transistors by performing dummy gate oxide formation first followed by well implant with a light concentration of dopants together with pocket implant of highly doped pockets according to one or more embodiments of the present disclosure.

FIG. 3 shows a process for fabricating MOS transistors by performing dummy gate oxide formation first followed by well implant with a light concentration of dopants together with pocket implant of highly doped pockets according to one or more embodiments of the present disclosure. Starting with a wafer substrate such as a semiconductor substrate of silicon, germanium, and/or a compound semiconductor material, a shallow trench isolation (STI) is formed on the substrate in step 301. As before, the STI may be formed to isolate the NMOS transistor from the PMOS transistor of a CMOS transistor pair.

In step 302, a dielectric layer is grown by exposing the wafer to oxygen to grow a thin layer of dummy oxide, such as a layer of silicon oxide on the wafer surface. In contrast to the process of FIG. 1, gate oxide formation is now performed before well implant. Therefore, there is no out-diffusion of the well dopants and no degraded retrograde well profiles caused by the high thermal budget associated with growing the oxide layer after well implant. Consequently, well implant may use a light concentration of dopants in the ion implantation step. In addition, because the variance in Vt is proportional to the square root of the dopant concentration, a light doping concentration also helps to control the fluctuation in Vt.

Step 303 performs well implant through the dummy oxide layer using a light concentration of dopants to form the wells for the transistors. For example, for a NMOS transistor, a P-well is implanted into the substrate, and for a PMOS transistor, an N-well is implanted into the substrate. In addition, a heavier concentration of dopants may also be implanted near the channel region to introduce a retrograde well profile for mitigating the short channel effects. Furthermore, in conjunction with the retrograde well implants, pocket implant may also be performed to introduce highly doped pockets underneath the channel near the junctions between the retrograde well and the drain and source regions. Because pocket implant is now performed before poly formation, there are no shadowing effects such as those associated with the process of FIG. 1 where incident ion beams for the pocket implant may be blocked by the close proximity of the poly gates. Consequently, pocket implant of step 303 may produce a more even distribution of implanted ions, preserving the effectiveness of the pocket implant to mitigate the short channel effects. Following the ion implant, step 304 performs annealing of the wells.

In step 305, a poly layer is deposited on top of the dummy oxide layer. In addition, a hard-mask layer such as one made of SiN may also be deposited. The poly layer is then patterned through a photolithography method and the dummy oxide layer not covered by the poly layer may be removed. The patterned poly layer in combination with the dummy oxide layer underneath thereof forms the dummy poly gates of the transistors. To control the short channel effects, a LDD region may be implanted in step 306 to reduce the depletion region near the drain. Because LDD implant may be performed using incident ion beams that are perpendicular to the wafer surface, LDD implant does not suffer from the shadowing effects associated with pocket implant that is performed after poly formation. Therefore, LDD implant may be performed after poly formation without degradation.

In step 307, ion diffusion or ion implantation is performed to diffuse or implant ions into the wells to form the source and the drain regions of the transistors using the dummy poly gates as the mask. For NMOS transistors, n-type impurities are diffused or implanted into the P-well to form the $n^+$ source and drain regions. For PMOS transistors, p-type impurities are diffused or implanted into the N-well to form the $p^+$ source and the drain regions. Optionally, for PMOS transistors, SiGe may be implanted to increase the mobility of the hole carriers through the channels. After the dummy poly gates have been used as the mask for the formation of the source and the drain regions, the dummy poly gates are removed in step 308. Because the dummy oxide layer was damaged when the well implant was performed through the dummy oxide layer in step 303, removal of the dummy poly gates also removes the damaged dummy oxide layer. An oxide interface layer is then deposited in preparation for deposit of a new oxide layer. Finally, in step 309 a layer of high k (dielectric) oxide layer and a metal layer are deposited and patterned to form the metal gates. Because the high k metal gate is completed last, the process of FIG. 3 is suitable for technology nodes that use a gate-last process.

Figure 4:
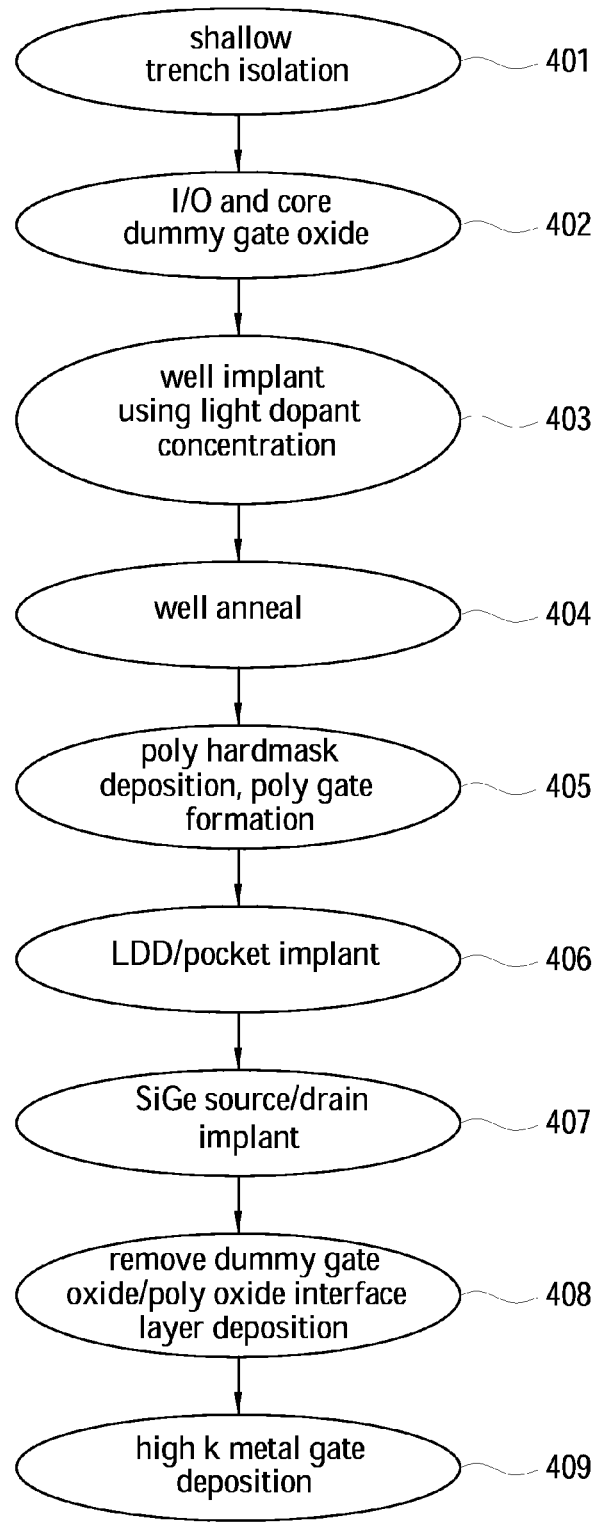
FIG. 4 shows an alternate process for fabricating MOS transistors by performing dummy gate oxide formation first followed by well implant with a light concentration of dopants that is performed separately from pocket implant of highly doped pocket according to one or more embodiments of the present disclosure.
Figure 5A:
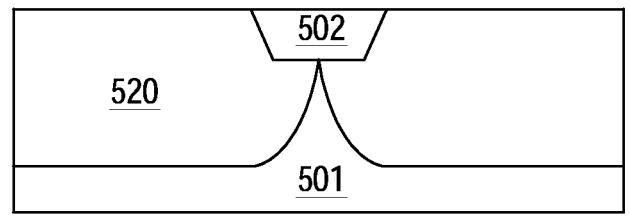
FIGS. 5A-5F (hereinafter referred to collectively as FIG. 5) show cross-sectional views of a N-channel MOS transistor and a P-channel MOS transistor at different stages of fabrication using the process of FIG. 3 according to one or more embodiments of the present disclosure.
Figure 5B:
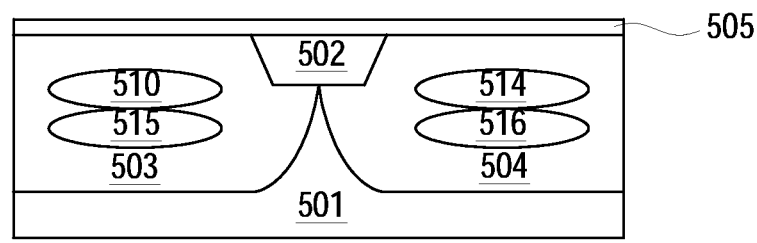
Figure 5C:
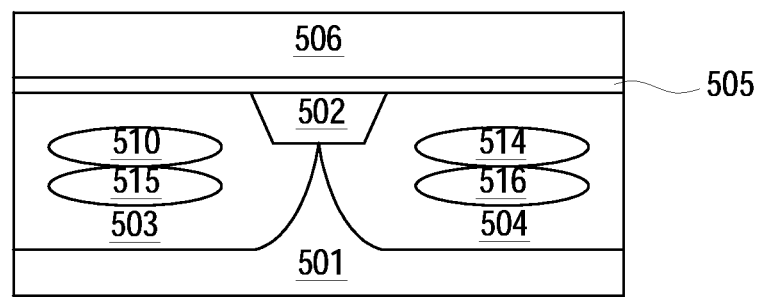
Figure 5D:
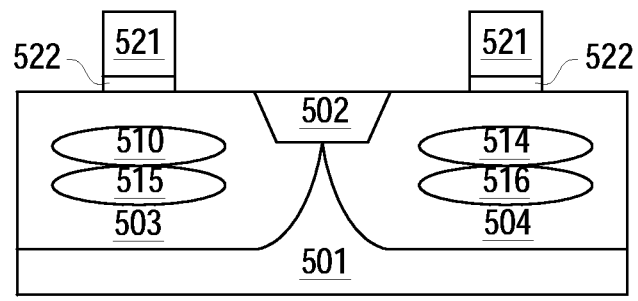
Figure 5E:
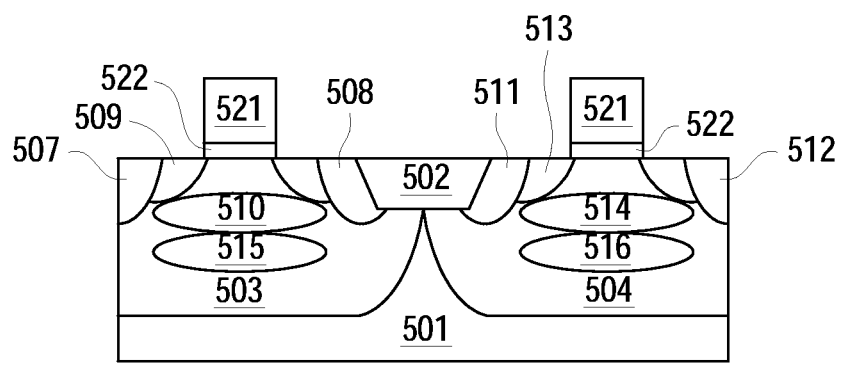
Figure 5F:
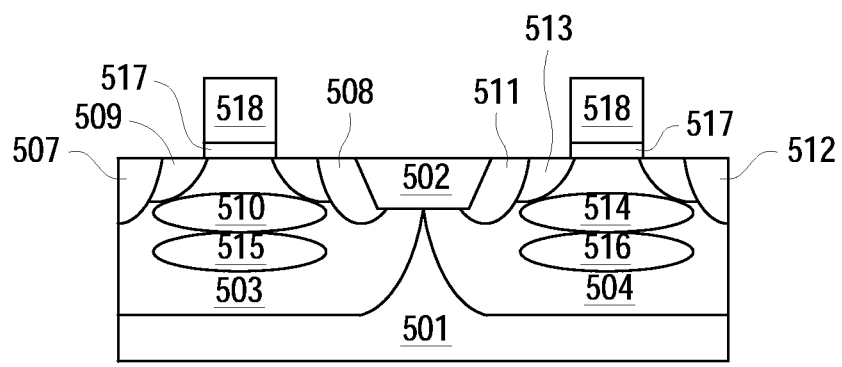
Figure 6A:
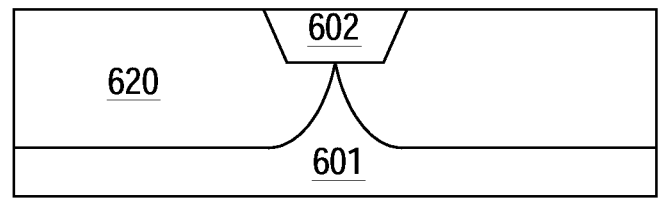
Figure 6B:
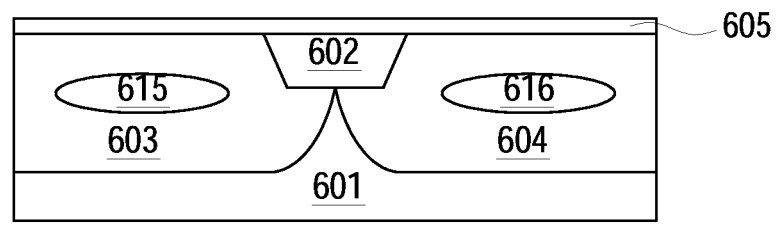
Figure 6C:
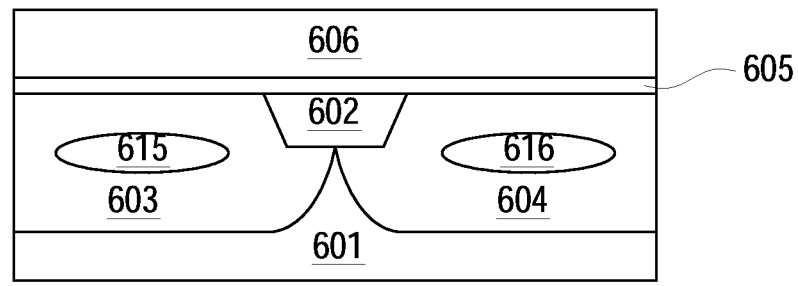
Figure 6D:
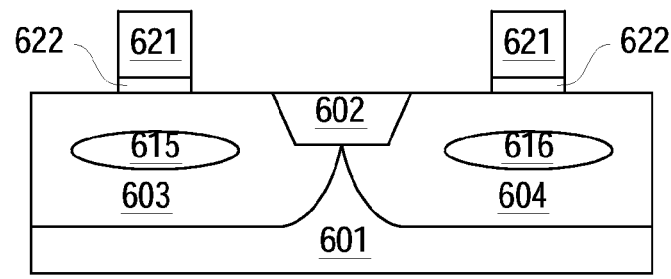
Figure 6E:
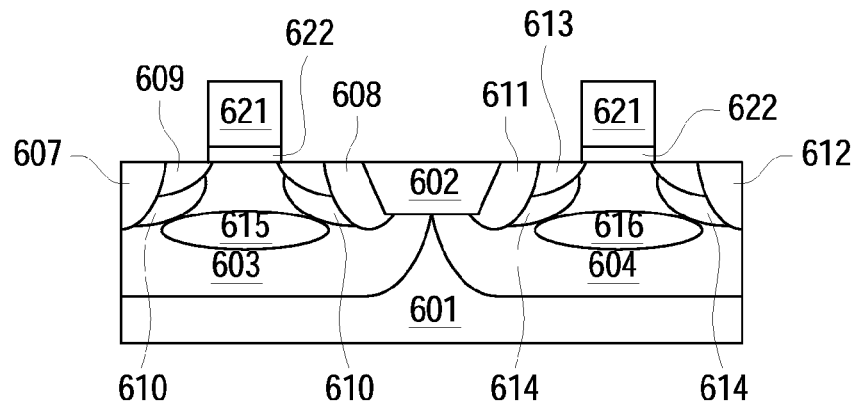
Figure 6F:
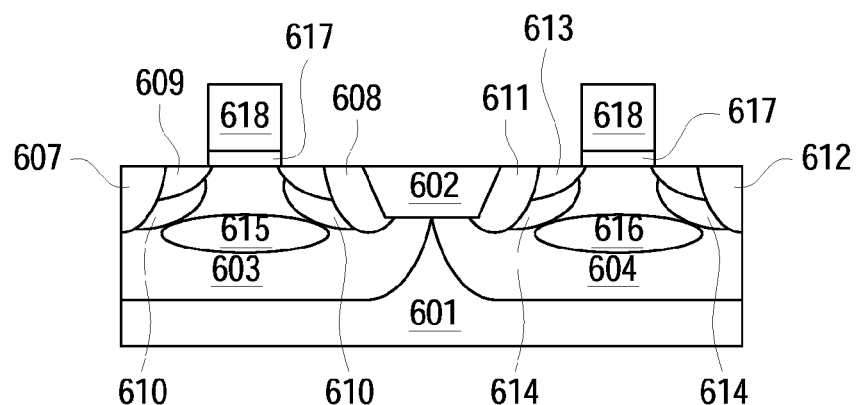

FIG. 4 shows an alternate process for fabricating MOS transistors by performing dummy gate oxide formation first followed by well implant with a light concentration of dopants that is performed separately from pocket implant of highly doped pocket according to one or more embodiments of the present disclosure. Steps 401 and 402 are the same as steps 301 and 302 of FIG. 3 for forming the STI and for growing the dummy oxide layer. Step 403 performs well implant through the dummy oxide layer using a light concentration of dopants. Similar to step 303, a heavier concentration of dopants may be implanted for the retrograde well profiles for mitigating the short channel effects. However, in contrast to step 303, pocket implant is not combined with well implant. Instead, pocket implant is performed in combination with LDD implant after poly formation. Similar to the pocket implant doping profile in FIG. 2, the pocket implant doping concentration has a non-uniform distribution. In one embodiment, the pocket implant is implemented using angled implantation. For example, the angled implantation has an implant tilt angle of about 20 degrees.

Step 404 performs well annealing as in step 304. Similarly, step 405 performs poly layer deposition, hard-mask layer deposition, and dummy poly gate formation through photolithography as in step 305. In step 406, LDD implant and pocket implant are performed to mitigate short channel effects as in step 106 of FIG. 1. Because ion beams for pocket implant may be blocked by the close proximity of the poly gates, the implanted pockets may have shadowing effects, in contrast to the process of FIG. 3. Steps 407 performs ion diffusion or ion implantation of the source and the drain regions using the dummy poly gates as the mask as in step 307. Similarly, step 408 removes the dummy gate oxide and the poly, and also deposits the oxide interface layer as in step 308. Finally, in step 409, a layer of high k (dielectric) oxide layer and a metal layer is deposited and patterned to form the metal gates, completing the high-k last process.

FIG. 5 shows a cross-sectional view of an N-channel and a P-channel MOS transistors fabricated using the process of FIG. 3 according to one or more embodiments of the present disclosure. Starting with a wafer of silicon substrate 501, active regions 520 are defined in the semiconductor substrate to contain wells for the transistors by forming one or more STI features 502. The STI features 502 isolate various devices (such as transistors) in the active regions 520 corresponding to process step 301. A thin dielectric layer of dummy oxide 505 is then grown on the wafer surface corresponding to process step 302 by exposing the wafer to oxygen. The active regions 520 are then implanted with a light concentration of dopants through the dummy oxide layer 505 followed by annealing to form the wells corresponding to process step 303 and 304. For the NMOS transistor, a light concentration of p-type impurities is implanted to form a P-well 503. Similarly, for the PMOS transistor, a light concentration of n-type impurities is implanted to form an N-well 504. In addition, to further control the short channel effects, implants of highly doped pockets may be performed underneath the channels and also near the junctions between the retrograde well and the source/drain regions to reduce the depletion width extending underneath the channel.

In one embodiment, a doping concentration of p-type impurities heavier than that of the P-well 503 of the NMOS transistor may be implanted in the P-well 503 near the N-channel to introduce a $p^+$ retrograde well profile 515 for mitigating the short channel effects. The $p^+$ retrograde well 515 may be formed using a doping dose less than about $5.7 \times 10^{13}$ atoms/cm$^2$ of p-type impurities such as boron difluoride (BF2), indium (In) or both. In one embodiment, the multi-implant process is implemented to incorporate both BF2 and In to form the p+ retrograde well profile 515. In another example, the ion implantation process may use an implantation energy of about 25 KeV for BF2 and about 60 KeV for In. In addition, the BF2 may be implanted to a depth of about 100 Å and the In to a depth of about 200 Å. Because there is no out-diffusion of the well dopants associated with growing the oxide layer after well implant, the dopant dosage may be reduced by 10% compared to that used in the process of FIG. 1. For example, the ion implantation for indium uses a dopant dosage of about $5.0 \times 10^{12}$ atoms/cm$^2$. Similarly, a heavier doping concentration of n-type impurities than that of the N-well 504 of the PMOS transistor may be implanted in the N-well 504 to introduce an n$^+$ retrograde well profile 516.

For the pocket implants, a p$^+$ pocket 510 is implanted for the NMOS transistor near the p$^+$ retrograde well 515 and an n$^+$ pocket 514 is implanted for the PMOS transistor near the n$^+$ retrograde well 516. For example, the implanted p$^+$ pocket 510 may be formed by an ion implantation with a doping dose of less than about $6 \times 10^{13}$ atoms/cm$^2$ of p-type impurities such as BF2 and In. The ion implantation process for the p$^+$ pocket 510 may use an implantation energy of about 25 KeV for the BF2 and about 40 KeV for the In and may further have a tilt angle of about 20°. In addition, the BF2/In ions is implanted to a depth of about 100 Å in one example. However, the pockets 510/514 and the retrograde wells 515/516 are extended to different depths in the substrate. Because there are no poly gates, the pocket implants are not degraded by the shadowing effects. Furthermore, thus formed pockets, such as 510 and 514, are substantially distributed in the channels as well. In contrast to the pocket implant formed after the poly gate, thus formed pocket implant has a substantially uniform distribution underneath the channel. Particularly, the doping concentrations of the pocket implant at both the channel edge and the channel center are substantially same, referred to as the uniform doping concentration of the pocket implant. If the non-uniformity of the pocket implant is evaluated by the same formula defined above, the non-uniformity is U=(Ce-Cc)/Ce, where Ce is the doping concentration at the channel edge and Cc is the doping concentration at the channel center. In this case, the non-uniformity U is substantially 0%. In one example, the uniform doping concentration of the pocket implant is less than about $6 \times 10^{19}$ atoms/cm$^3$.

In contrast, the pocket implant formed after the poly gate in the existing technology, the doping profile has a varying doping concentration. Specifically, the doping profile has a gradient doping concentration, decreasing from the channel edge to the channel center. In particular example, the gradient doping concentration is reduced from a highest doping concentration at the channel edge to a lowest doping concentration at the channel center. The lowest doping concentration is less than about 20% of the highest doping concentration. In one example of the gradient doping concentration, the highest doping concentration at the channel edge is about $6 \times 10^{19}$ atoms/cm$^3$ and the lowest doping concentration at the channel center is about $1 \times 10^{19}$ atoms/cm$^3$. As noted earlier, the non-uniformity U in this case is greater than about 83%.

In another embodiment, the disclose pocket implant has a doping concentration greater than the doping concentration of the retrograde well. For example, retrograde well has a doping concentration less than about $4 \times 10^{19}$ atoms/cm$^3$. The pocket implant has a doping concentration less than about $6 \times 10^{19}$ atoms/cm$^3$.

A poly layer 506 is then deposited on top of the dummy oxide layer 505. The poly layer 506 is patterned through a photolithography process corresponding to step 305 to form the poly layer 521 of the MOS transistors. The dummy oxide layer 505 not covered by the poly layer may then be etched away. The patterned poly layer 521 and its underneath dummy oxide layer 522 form the dummy poly gates for the MOS transistors. To control short channel effects, a LDD region may be implanted near the dummy poly gate corresponding to process step 306. For the NMOS transistor, a lightly doped n-region 509 may be implanted near the dummy poly gate. Similarly, for the PMOS transistor, a lightly doped p-region 513 may be implanted. Ion implantation corresponding to process step 307 is performed to implant ions into the wells to form the source and the drain regions of the transistors using the dummy poly gates as the mask. For the NMOS transistor, n-type impurities are implanted into the P-well 503 to form an n$^+$ source 508 and an n$^+$ drain 507 region. Similarly, for the PMOS transistor, p-type impurities are implanted into the N-well 504 to form a p$^+$ source 512 and a p$^+$ drain 511 regions. Following the formation of the source and drain regions, a dielectric layer (not illustrated) is formed around the dummy poly gates. Then the dummy poly gates are removed corresponding to process step 308 to remove the dummy oxide layer that was damaged when the well implant was performed through the dummy oxide layer. The removal of the dummy poly gates leave openings (not illustrated) or trenches in the dielectric layer. Thereafter, corresponding to step 309, metal gates are formed in these openings or trenches to replace the dummy poly gates. The metal gates each include a high k gate dielectric layer 517 and a metal gate electrode layer 518.

FIG. 6 shows a cross-sectional view of an N-channel and a P-channel MOS transistors fabricated using the process of FIG. 4 according to one or more embodiments of the present disclosure. As in FIG. 5, active regions 620 are defined on a wafer of silicon substrate 601 after one or more STI features 602 are formed corresponding to process step 401. A thin dielectric layer of dummy oxide 605 is grown on the wafer surface corresponding to process step 402. As in FIG. 5, the active regions 620 are implanted with a light concentration of dopants through the dummy oxide layer 605 corresponding to process steps 403, 404 to form a P-well 603 and an N-well 604. Also as in FIG. 5, a heavier concentration of dopants are implanted for the p$^+$ retrograde well profile 615 and for the n$^+$ retrograde well profile 616. In one embodiment, the p$^+$ retrograde well 615 may be formed using a doping dose less than about $5.7 \times 10^{13}$ atoms/cm$^2$ of p-type impurities such as BF2, In or both. In one embodiment, the multi-implant process is implemented to incorporate both BF2 and In to form the p+ retrograde well profile 615. In another example, the ion implantation process may use an implantation energy of about 25 KeV for BF2 and about 60 KeV for In. In addition, the BF2 may be implanted to a depth of about 100 Å and the In to a depth of about 200 Å. However, in contrast to FIG. 5, pocket implant is not performed with well implant. Instead, pocket implant is performed in combination with LDD implant after poly formation.

Similar to FIG. 5, a poly layer 606 is deposited and patterned to form dummy poly gates consisting of a patterned poly layer 621 and a patterned dummy oxide layer 622 corresponding to process step 405. LDD regions are also implanted near the dummy poly gates corresponding to process step 406 to form a lightly doped n-region 609 and a lightly doped p-region 613. Because pocket implant was not performed with well implant in contrast to FIG. 5, pocket implant may now be performed to introduce a p$^+$ pocket 610 and a n$^+$ pocket 614 near the p$^+$ retrograde well 615 and the n$^+$ retrograde well 616 respectively. In one embodiment, the ion implantation process for the p$^+$ pocket 610 may use an implantation energy of about 25 KeV for the BF2 and about 40 KeV for the In with a tilt angle of about 20°. In addition, the BF2/In ions is implanted to a depth of about 100 Å in one example. However, the implanted pockets may have shadowing effects because pocket implant is performed after the formation of the poly gates. As in FIG. 5, ion implantation corresponding to process step 407 is performed to form an n⁺ source 608 and an n⁺ drain 607 region for the NMOS transistor, and a p⁺ source 612 and a p⁺ drain 611 for the PMOS transistor. Following the formation of the source and drain regions, a dielectric layer (not illustrated) is formed around the dummy poly gates. Then the dummy poly gates are removed corresponding to step 408, leaving openings (not illustrated) or trenches in the dielectric layer. Thereafter, corresponding to step 409, metal gates are formed in these openings or trenches to replace the dummy poly gates. The metal gates each include a high k gate dielectric layer 617 and a metal gate electrode layer 618.

Although embodiments of the present disclosure have been described, these embodiments illustrate but do not limit the disclosure. It should also be understood that embodiments of the present disclosure should not be limited to these embodiments but that numerous modifications and variations may be made by one of ordinary skill in the art in accordance with the principles of the present disclosure and be included within the spirit and scope of the present disclosure as hereinafter claimed.

What is claimed is:

1. A field-effect transistor (FET) comprising:
   a well of a first type dopant, formed in a semiconductor substrate;
   a metal gate disposed on the semiconductor substrate and overlying the well;
   a channel formed in the semiconductor substrate and underlying the metal gate;
   a lightly doped source region and a lightly doped drain region of a second type dopant opposite from the first type, the lightly doped source region and the lightly doped drain region being formed in the semiconductor substrate and on opposite sides of the channel; and
   a pocket doping profile of the first type dopant defined in the well to form a pocket implant region directly interfacing with the lightly doped source region and the lightly doped drain region, wherein the pocket implant region has a uniform doping concentration extending continuously from the lightly doped source region to the lightly doped drain region.

2. The FET of claim 1, further comprising a retrograde well profile of the first type dopant and a first doping concentration, the retrograde well profile being defined in the well and having a first depth, wherein the pocket doping profile has a second depth less than the first depth and a second doping concentration greater than the first doping concentration.

3. The FET of claim 1, wherein the non-uniformity of the pocket doping profile is substantially about 0%.

4. The FET of claim 1, wherein:
   the first doping concentration of the retrograde well profile is less than about $4 \times 10^{19}$ atoms/cm³; and
   the second doping concentration of the pocket doping profile is less than about $6 \times 10^{19}$ atoms/cm³.

5. The FET of claim 1, wherein the first depth of the retrograde well profile is about 200 angstroms and the second depth of the pocket doping profile is less than about 100 angstroms.

6. The FET of claim 1, wherein the pocket doping profile comprises indium and boron difluoride uniformly distributed in the channel.

7. A device comprising:
   a doped well of a first type dopant formed in a semiconductor substrate;
   a gate stack disposed over the well;
   a lightly doped source feature disposed in the semiconductor substrate on a first side of the gate stack, the lightly doped source feature having a second type dopant that is opposite the first type dopant;
   a lightly doped drain disposed in the semiconductor substrate on a second side of the gate stack that is opposite the first side of the gate stack, the lightly doped drain feature having the second type dopant; and
   a pocket implant feature having the first type dopant disposed in the substrate and directly interfacing with the lightly doped source feature and the lightly doped drain feature, wherein the pocket implant feature has a uniform doping concentration extending continuously from the lightly doped source feature to the lightly doped drain feature.

8. The device of claim 7, wherein a portion of the doped well is positioned between the lightly doped source feature and the pocket implant feature.

9. The device of claim 7, further comprising a retrograde well disposed below the pocket implant feature, wherein the retrograde well has the first type dopant.

10. The device of claim 9, wherein the retrograde well directly interfaces with the pocket implant feature.

11. The device of claim 9, wherein the pocket implant feature has a first concentration of the first type dopant and the retrograde well has a second concentration of the first type dopant, wherein the first concentration is greater than the second concentration.

12. The device of claim 7, further comprising a heavily doped source feature interfacing with the lightly doped source feature, wherein the heavily doped source feature includes the second type dopant at a first concentration that is greater than a second concentration of the second type dopant in the lightly doped source feature; and
   a heavily doped drain feature interfacing with the lightly doped drain feature, wherein the heavily doped drain feature includes the second type dopant at a third concentration that is greater than a fourth concentration of the second type dopant in the lightly doped drain feature.

13. The device of claim 7, wherein the gate stack includes a metal gate electrode.

14. A device comprising:
   a gate stack disposed over a semiconductor substrate;
   a lightly doped source feature disposed in the semiconductor substrate on a first side of the gate stack, the lightly doped source feature having a first type dopant;
   a lightly doped drain feature disposed in the semiconductor substrate on a second side of the gate stack that is opposite the first side of the gate stack, the lightly doped drain feature having the first type dopant; and
   a pocket implant feature having a second type dopant disposed in the substrate and directly interfacing with the lightly doped source feature and the lightly doped drain feature, wherein the pocket implant feature has a uniform doping concentration extending continuously from the lightly doped source feature to the lightly doped drain feature.

15. The device of claim 14, further comprising a channel of the gate stack disposed in the substrate above the pocket implant feature and extending from the lightly doped source feature to the lightly doped drain feature.

16. The device of claim 14, further comprising a retrograde well disposed below the pocket implant feature and interfacing with the pocket implant feature.

17. The device of claim 16, further comprising a well region having the second type dopant, wherein a portion of the well region is positioned between the pocket implant feature and the retrograde well.

18. The device of claim 14, wherein a portion of the lightly doped source feature extends directly under the gate stack, and wherein a portion of the lightly doped drain feature extends directly under the gate stack.

19. The device of claim 14, further comprising a heavily doped source feature adjacent the lightly doped source feature, the heavily doped source feature having the first type dopant; and a heavily doped drain feature adjacent the lightly doped drain feature, the heavily doped drain feature having the first type dopant.

20. The device of claim 7, wherein a portion of the lightly doped source feature extends directly under the gate stack, and wherein a portion of the lightly doped drain feature extends directly under the gate stack.

* * * * *